United States Patent [19]
Gardner et al.

[11] Patent Number: 5,933,747
[45] Date of Patent: Aug. 3, 1999

[54] METHOD AND STRUCTURE FOR AN ADVANCED ISOLATION SPACER SHELL

[75] Inventors: Mark I. Gardner, Cedar Creek; Thomas E. Spikes, Jr., Round Rock, both of Tex.

[73] Assignee: Advanced Micro Devices, Inc., Sunnyvale, Calif.

[21] Appl. No.: 08/993,390

[22] Filed: Dec. 18, 1997

[51] Int. Cl.$^6$ .................................................. H01L 21/76
[52] U.S. Cl. .......................... 438/424; 438/427; 438/435; 438/445
[58] Field of Search ..................................... 438/639, 640, 438/424, 426, 435, 445, 427, 446

[56] References Cited

U.S. PATENT DOCUMENTS

| | | | |
|---|---|---|---|
| 4,385,975 | 5/1983 | Chu et al. ................................ | 438/427 |
| 4,871,689 | 10/1989 | Bergani et al. .......................... | 438/427 |
| 5,435,888 | 7/1995 | Kalnitsky et al. ....................... | 438/624 |
| 5,466,637 | 11/1995 | Kim ....................................... | 438/639 |
| 5,763,315 | 6/1998 | Benedict et al. ........................ | 438/424 |

*Primary Examiner*—Richard A. Booth
*Assistant Examiner*—Ha Tran Nguyen

[57] ABSTRACT

A method and structure are provided for a spacer shell structure which is formed of dielectric materials seletive to one another. The dielectric materials can be configured into a chosen geometric arrangement. The isolation properties of the spacer shell can be scaled to meet a given set of isolation requirements as determined by the size and density of the IGFET devices being isolated. The method to fabricate the novel spacer shell maintains costly fabrication steps at a minimum. The isolation ability of the novel spacer shell preserves the operation integrity of neighboring IGFET devices. Electrical shorts between adjacent devices are prevented. Capacitive coupling between neighboring IGFET structures is likewise minimized.

6 Claims, 3 Drawing Sheets

METHOD AND STRUCTURE FOR AN ADVANCED ISOLATION SPACER SHELL

FIELD OF THE INVENTION

The present invention relates generally to semiconductor integrated circuits. More particularly, it pertains to the method and structure for an advanced isolation spacer shell.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a dielectric layer. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

Several objectives influence IGFET design and fabrication. First, there is a desire to reduce the dimensions of the IGFET. Increasing the number of individual IGFETs that can be placed onto a single silicon chip or die produces increased functionality per chip. Second, there is a continual desire is to improve performance, and particularly the speed, of the IGFET transistors. This pursuit is manifested in shorter conduction channel lengths and in efforts to obtain low contact resistivity at the IGFET junctions. These aspects offer increased IGFET speed and allow for a greater number of operations to be performed by the IGFET in less time. IGFETs are used in great quantity in computers where the push to obtain higher operation cycle speeds demands faster IGFET performance. Lastly, there exists a constant need to maintain costly IGFET fabrication steps at a minimum.

As the feature dimensions of the IGFET device decrease, new performance hurdles present themselves. One particular difficulty, concerns electrical shorts between IGFET devices and capacitive coupling between the closely stacked IGFET structures. As the IGFETS are pushed into a more dense arrangement next to one another there is a heightened tendency for stray electrical signals to pass from device to device. The stray electrical signals cause the IGFETs to malfunction or possible breakdown entirely. Spacer shells are utilized to isolate the individual IGFET devices from each other. The better the geometric configuration and material makeup of the dielectric fill the more improved the isolation properties of the spacer shell.

As shown above, a threshold point exist where heightened speed and reduced dimensions will lead to IGFET breakdown. Conventional approaches have encountered difficulty trying to maintain IGFET performance in the face of decreasing IGFET size and increasing IGFET density on the surfaces of silicon die. In the effort to overcome these hurdles, it is equally desirable to keep costly processing steps to a minimum. Thus, it is an objective to uncover new spacer shell structures which provide the needed isolation properties. It is a further objective to uncover methods to produce new spacer shell structures which facilitate increased performance and but which do not compromise the IGFET's longevity or fabrication budget.

SUMMARY OF THE INVENTION

A method for forming an advanced isolation spacer shell is provided. The method of fabrication includes forming a trench within a surface of a semiconductor substrate. A first dielectric region is formed within the trench. Next, a second dielectric region is formed within the trench adjacent to the first dielectric region. Then, a third dielectric region is formed within the trench adjacent to the first and second dielectric regions.

In one embodiment, the first dielectric region is a material having a low dielectric constant. The first dielectric region is formed into a first pair of dielectric spacers against opposing walls within the trench. The second dielectric region is similarly formed into a second pair of dielectric spacers disposed adjacent to the first dielectric region. The second dielectric region is selective to the first dielectric region.

A spacer shell structure is provided which has a novel geometric configuration. The spacer shell structure includes a trench formed within a surface of a semiconductor substrate. A first dielectric region is provided within the trench. A second dielectric region is formed within the trench and disposed adjacent to the first dielectric region. A third dielectric region is formed within the trench adjacent to the first and second dielectric regions.

An information handling system is also provided which includes the above spacer shell structure. The system has a central processing unit, a random access memory; and a system bus for coupling the central processing unit to the random access memory. As stated, the system includes the above space shell structure along with each of its features. Those features include the trench formed within a surface of a semiconductor substrate. A first dielectric region is provided within the trench. A second dielectric region is formed within the trench and disposed adjacent to the first dielectric region. A third dielectric region is formed within the trench adjacent to the first and second dielectric regions.

Thus a novel spacer shell structure is provided which provides necessary isolation properties between IGFET devices. The structure and method of fabrication produce a selective geometric configuration to the spacer shell without significantly increasing costly fabrication steps. The isolation properties of the spacer shell preserve the operation and performance of adjacent IGFET devices from being affected by capacitive coupling or electrical signal shorts between neighboring devices.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the embodiments can best be understood when read in conjunction with the following drawings, in which.

DETAILED DESCRIPTION OF THE EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

Figure 1A:
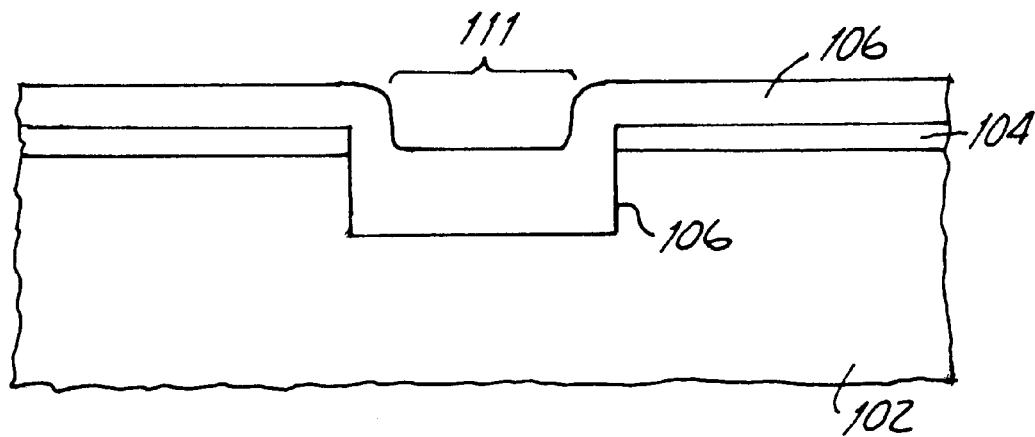
FIGS. 1A–1C show cross-sectional views of successive process steps for making an advanced isolation spacer shell between IGFET devices in accordance with an embodiment of the invention.
Figure 1B:
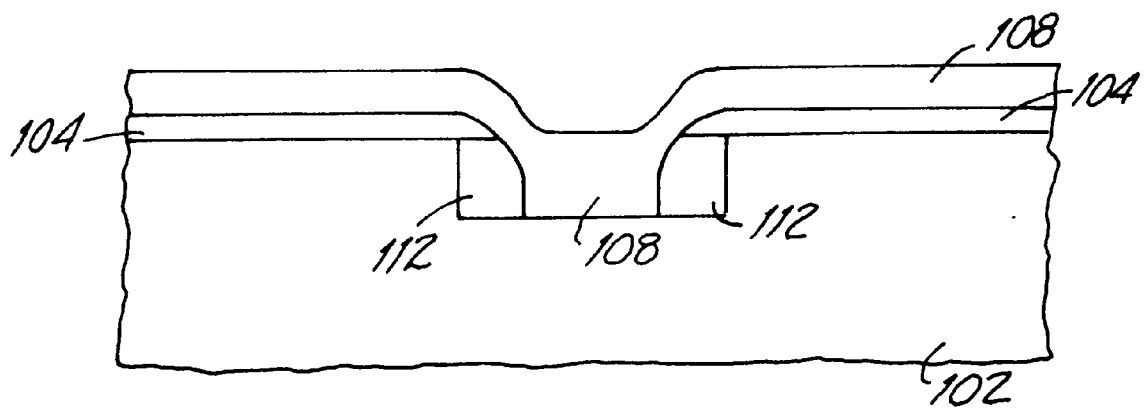
Figure 1C:
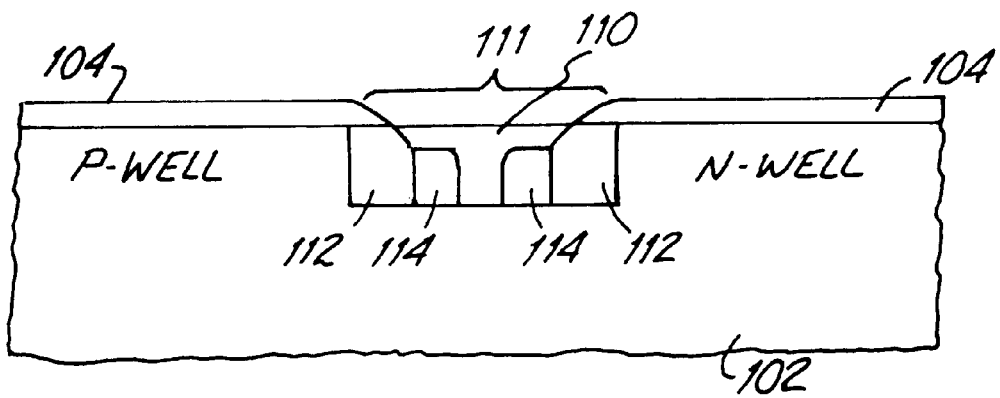

FIGS. 1A–1C, describe generally various processing techniques of one embodiment of an advanced isolation spacer shell structure for separating IGFET devices.

FIG. 1A, illustrates the structure after the first sequence of process steps. A substrate 102 is provided which has an upper surface. The upper surface of the substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. Preferably, the epitaxial surface layer of the substrate 102 is disposed on a P+base layer (not shown) and includes a planar top surface. In an alternative embodiment, the substrate 102 is an N-type substrate on an N+base layer.

A dielectric layer 104 is provided on the upper surface of the substrate 102. The dielectric layer 104 is an composed of sandwiched stack of silicon oxide, silicon nitride, and silicon oxide (ONO). In making the ONO dielectric 102, the first or bottom silicon oxide, (O layer) is formed by, for example, exposure to deionized water (DI) to form a native silicon oxide having a thickness of approximately 50 Angstroms. The silicon nitride, (N layer) is formed by LPCVD wherein the gases are ammonia and SiH$_2$C$_2$, temperature of approximately 760 Degrees Celsius, pressure of approximately 350 mTorr., to give a resulting thickness of between approximately 50 to 70 Angstroms. The top silicon oxide, (O layer) may be formed by exposing the N layer to dry oxygen at about 850 degrees Celsius for about 30 minutes to form a silicon nitride/oxide layer.

A photoresist is applied and exposed to form a mask over adjacent IGFET devices which the spacer shell will isolate. A trench 111 is formed within the surface of the semiconductor substrate. The trench is formed by any suitable measure, such as by reactive ion etching (RIE). In an alternative embodiment, a wet etch process is used, such a solution of nitric and hydrofluoric acid (HF) mixed in water. The photoresist is subsequently removed using conventional photoresist stripping techniques. A first dielectric region 106 is formed in trench 111 by depositing a material having a low dielectric constant (K). The dielectric constant value is defined as the ratio of the dielectric constant of the layer 106 to the dielectric constant of air. In one embodiment, K is less than or equal to four ($\leq 4$). The first dielectric region 106 can be formed through any suitable process, such as by chemical vapor deposition (CVD). The structure is now as shown in FIG. 1A.

FIG. 1B illustrates the structure following the next sequence of process steps. In FIG. 1B, the first dielectric region is etched back to form a first pair of dielectric spacers 112 disposed against opposing walls within the trench 111. The etching is performed by any suitable means such by reactive ion etching (RIE), or alternatively, by use of a buffered oxide etch (BOE). A second dielectric region 108 is then formed within trench 111 and adjacent to the first pair of dielectric spacers 112. The second dielectric region 108 is an oxide material and is selective to the first pair of dielectric spacers 112. The second dielectric region 108 is deposited through any suitable means, such as by chemical vapor deposition (CVD). The structure is now as shown in FIG. 1B.

FIG. 1C illustrates the final sequence of process steps associated with the present invention. In FIG. 1C, the second dielectric region is etched back to form a second pair of a dielectric spacers 114 disposed adjacent to the first pair of dielectric spacers 112. The etching process is again performed by any suitable means such by reactive ion etching (RIE), or alternatively, by use of a buffered oxide etch (BOE). A third dielectric region 110 is then formed within the trench 111 and adjacent to the first and second pair of dielectric spacers, 112 and 114 respectively. The third dielectric region 110 is again a material having low dielectric constant (K). The third dielectric region 110 is deposited through any suitable means, such as by chemical vapor deposition (CVD). In one embodiment, the third dielectric region 110 is formed of the same material as the first pair of dielectric spacers 112. In an alternative embodiment, the third dielectric region 110 is formed of a material which is selective to both the first and second pair of dielectric spacers, 112 and 114 respectively. The completed structure is now as shown in FIG. 1C.

Figure 2:
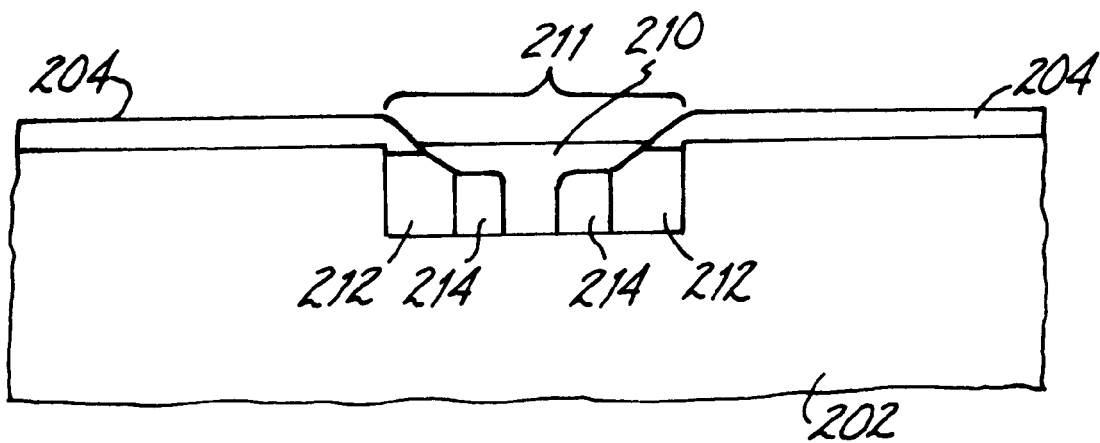
FIG. 2 illustrates the completed isolation spacer shell structure in accordance with an embodiment of the invention.

The present invention includes numerous variations to the embodiment described above. For instance, the completed device illustrated FIG. 2 is one embodiment of the invention. FIG. 2 is a cross sectional view wherein a trench 211 is provided through a dielectric layer 204 and into the surface of the semiconductor substrate 202. A first pair of dielectric spacers 212 are provided against opposing walls within the trench 211. The first pair of dielectric spacers 212 were formed by first depositing a first dielectric region (not shown) and then etching back the region to form the pair of spacers against the opposing walls of the trench 211. The first pair of dielectric spacers 212 are formed of a material having a low dielectric constant (K). The dielectric constant value is defined as the ratio of the dielectric constant of the material in question in relation to the dielectric constant of air. In one embodiment, the first pair of dielectric spacers 212 have a K value which is less than or equal to four ($\leq 4$). A second pair of dielectric spacers 214 are disposed adjacent to the first pair of dielectric spacers 212. The second pair of spacers 214 were formed by first depositing a second dielectric region (not shown) and then etching back the region to form the second pair of dielectric spacer 214 disposed adjacent to the first pair of dielectric spaces 212. The second dielectric region (not shown) and the subsequent second pair of dielectric spacers 214 are an oxide material which is selective to the first pair of dielectric spacers 212. A third dielectric region 210 is also formed within the trench. The third dielectric region 210 is again a material having low dielectric constant (K). In one embodiment, the third dielectric region 210 is formed of the same material as the first pair of dielectric spacers 212. In an alternative embodiment, the third dielectric region 210 is formed of a material which is selective to both the first and second pair of dielectric spacers, 212 and 214 respectively.

Thus the invention provides a method and structure for a spacer shell with dielectric materials which are selective to one another and configured into a chosen geometric arrangement. The isolation properties of the spacer shell can be scaled to meet a given set of requirements as determined by the size and density of the IGFET devices being isolated. The method to fabricate the novel spacer shell maintains costly fabrication steps at a minimum. The isolation ability of the novel spacer shell preserves the integrity of neighboring device operation by preventing electrical shorts between devices. Capacitive coupling between neighboring IGFET structures is likewise minimized.

Figure 3:
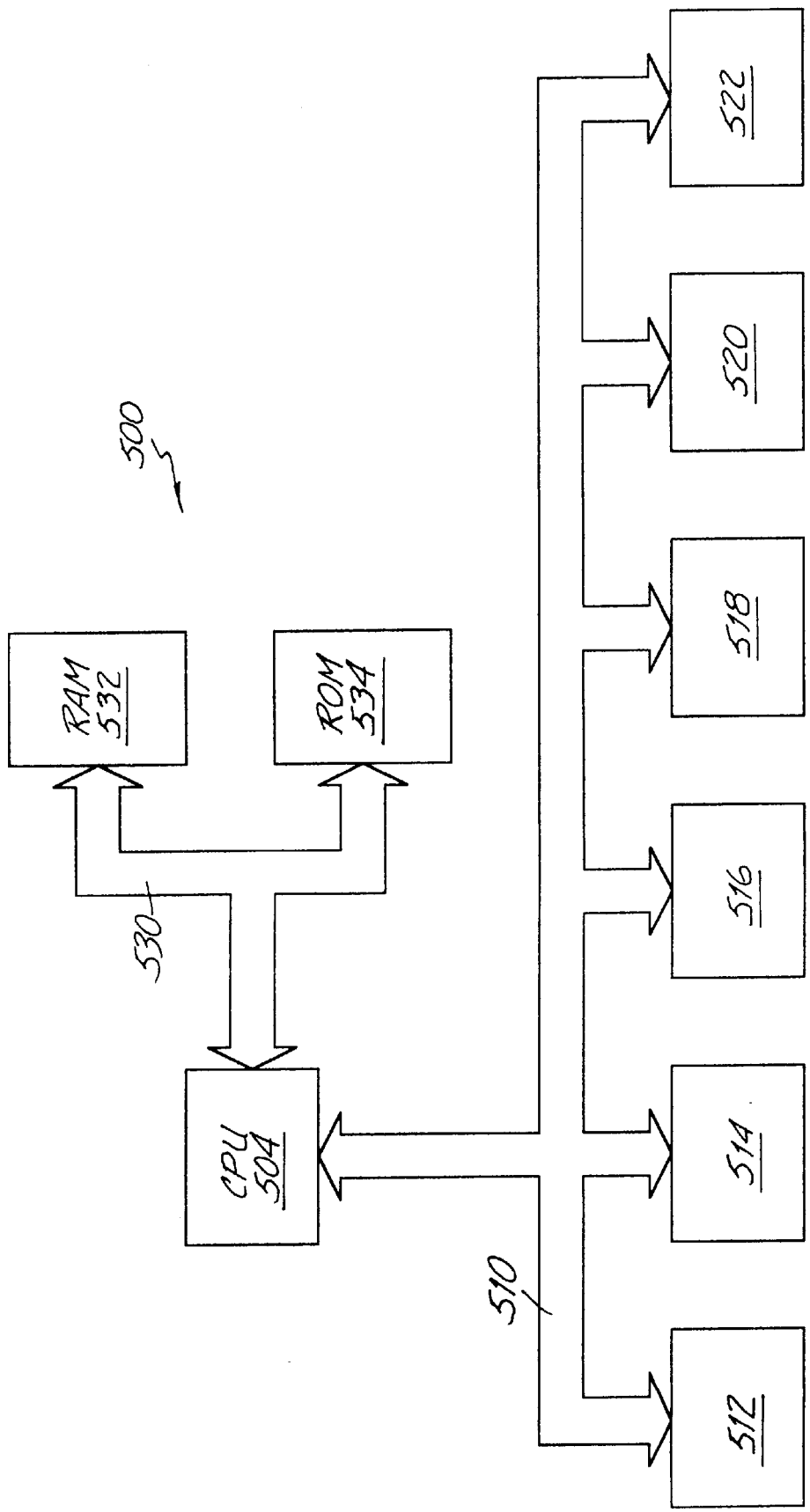
FIG. 3 is a block diagram of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a novel spacer shell structure such as is shown in FIG. 2. The selectivity of the dielectric materials allow for scalable geometric configuration within a reasonable processing budget. The isolation properties of the spacer shell ensure the correct transmission of electrical signals throughout the information handling system.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a spacer shell comprising:

forming a trench within a surface of a semiconductor substrate;

forming with a first material a first pair of dielectric spacers against opposing walls within the trench;

forming with a second material that is selective to the first material a second pair of dielectric spacers within the trench adjacent to the first pair of dielectric spacers; and filling the trench between the second pair of spacers with a third dielectric material.

2. The method of claim 1 wherein the first material has a low dielectric constant.

3. The method of claim 2 wherein forming a third dielectric region comprises the same material as the first dielectric region.

4. The method of claim 1 wherein the second material is a silicon oxide.

5. The method of claim 1 wherein the third material has a low dielectric constant.

6. The method of claim 1 wherein the third material has a low dielectric constant and is selective to both the first material and the second material.

* * * * *